(12) United States Patent
Hanajima

(10) Patent No.: US 10,211,081 B2
(45) Date of Patent: Feb. 19, 2019

(54) PROCESSING METHOD OF WORKPIECE

(71) Applicant: DISCO CORPORATION, Tokyo (JP)

(72) Inventor: Satoshi Hanajima, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/886,001

(22) Filed: Feb. 1, 2018

(65) Prior Publication Data
US 2018/0218932 A1 Aug. 2, 2018

(30) Foreign Application Priority Data

Feb. 1, 2017 (JP) .................. 2017-016803

(51) Int. Cl.
| | |
|---|---|
| *H01L 21/00* | (2006.01) |
| *H01L 21/68* | (2006.01) |
| *H01L 21/67* | (2006.01) |
| *H01L 21/687* | (2006.01) |
| *H01L 21/78* | (2006.01) |
| *H04N 5/33* | (2006.01) |
| *G06T 7/70* | (2017.01) |
| *H01L 23/544* | (2006.01) |

(52) U.S. Cl.
CPC .............. *H01L 21/681* (2013.01); *G06T 7/70* (2017.01); *H01L 21/67092* (2013.01); *H01L 21/68764* (2013.01); *H01L 21/78* (2013.01); *H01L 23/544* (2013.01); *H04N 5/33* (2013.01); *G06T 2207/30148* (2013.01); *G06T 2207/30204* (2013.01); *H01L 2223/54426* (2013.01)

(58) Field of Classification Search
CPC .................................................... H01L 21/681
See application file for complete search history.

(56) References Cited

U.S. PATENT DOCUMENTS

| | | | | |
|---|---|---|---|---|
| 3,760,181 A | * | 9/1973 | Daly ........................ | H04N 3/09 250/332 |
| 7,396,704 B2 | * | 7/2008 | Maeda ................ | B29C 45/0025 257/434 |
| 7,592,200 B2 | * | 9/2009 | Maeda .............. | H01L 27/14618 438/27 |
| 2004/0262705 A1 | * | 12/2004 | Izumi ................ | H01L 27/14625 257/432 |

(Continued)

FOREIGN PATENT DOCUMENTS

JP 07-106405 4/1995

*Primary Examiner* — Caleb Henry
(74) *Attorney, Agent, or Firm* — Greer Burns & Crain Ltd.

(57) ABSTRACT

A processing method for processing a workpiece includes a holding step of holding the front surface side of the workpiece on which an alignment mark is formed by a holding table having a holding surface that reflects a near-infrared ray and exposing the back surface side and an imaging step of emitting the near-infrared ray toward the back surface side of the workpiece held by the holding table and imaging the workpiece by an imaging unit that has sensitivity to the near-infrared ray and faces the back surface side of the workpiece to form a captured image. The processing method also includes an alignment mark detection step of detecting the alignment mark based on the captured image and a processing step of processing the workpiece held by the holding table by a processing unit based on the detected alignment mark.

1 Claim, 2 Drawing Sheets

(56) References Cited

U.S. PATENT DOCUMENTS

| | | | |
|---|---|---|---|
| 2005/0087132 A1* | 4/2005 | Dickey | G02B 5/285 118/715 |
| 2005/0180010 A1* | 8/2005 | Mukaiyama | G02B 5/282 359/487.04 |
| 2005/0275746 A1* | 12/2005 | Nishida | G02B 7/02 348/360 |
| 2006/0051887 A1* | 3/2006 | Yamamoto | H01L 27/14618 438/64 |
| 2006/0124833 A1* | 6/2006 | Toda | H01L 27/14621 250/214 R |
| 2006/0215266 A1* | 9/2006 | Uehara | G02B 5/3083 359/487.04 |
| 2007/0010041 A1* | 1/2007 | Kang | H01L 27/14618 438/64 |
| 2007/0202696 A1* | 8/2007 | Inuiya | H01L 27/14632 438/666 |
| 2007/0247534 A1* | 10/2007 | Murata | H01L 27/14618 348/294 |
| 2007/0275505 A1* | 11/2007 | Wolterink | G02B 13/006 438/118 |
| 2008/0001068 A1* | 1/2008 | Farnworth | H01L 27/14618 250/208.1 |
| 2008/0037129 A1* | 2/2008 | Hodgson | G02B 5/285 359/588 |
| 2008/0054803 A1* | 3/2008 | Zheng | H01L 33/50 313/506 |
| 2008/0128848 A1* | 6/2008 | Suzuki | H01L 23/481 257/448 |
| 2008/0185603 A1* | 8/2008 | Itoi | A61B 1/05 257/98 |
| 2008/0224249 A1* | 9/2008 | Nabe | H01L 27/14618 257/433 |
| 2008/0231739 A1* | 9/2008 | Takasaki | H01L 27/146 348/311 |
| 2008/0237768 A1* | 10/2008 | Yajima | H01L 23/26 257/434 |
| 2008/0239138 A1* | 10/2008 | Sano | G02B 9/34 348/340 |

* cited by examiner

PROCESSING METHOD OF WORKPIECE

BACKGROUND OF THE INVENTION

Field of the Invention

The present invention relates to a processing method for processing a workpiece having coating layers that reflect a visible light ray on the front and back surface sides.

Description of the Related Art

When a plate-shaped workpiece typified by a semiconductor wafer is processed, processing apparatus including a chuck table for holding the workpiece and a processing unit for processing the workpiece held by the chuck table is used. When the workpiece is processed by this processing apparatus, processing called alignment for causing the processing apparatus to recognize the position, orientation, and so forth of the workpiece needs to be executed.

In the alignment, for example, the workpiece held by the chuck table is imaged by an imaging unit and a pattern that corresponds with a characteristic key pattern (target pattern, alignment mark) stored in the processing apparatus in advance is found out from the workpiece. Then, the chuck table is rotated based on the position of the found-out pattern to adjust the orientation of the workpiece (for example, refer to Japanese Patent Laid-open No. Hei 7-106405). Furthermore, from the distance between a planned processing line (street) and the key pattern stored in the processing apparatus and the position of the found-out pattern, the position of the actual planned processing line is calculated. Thereafter, by adjusting the processing unit to the calculated position of the actual planned processing line, the workpiece can be processed along this planned processing line.

SUMMARY OF THE INVENTION

However, for example, if coating layers that reflect a visible light ray are formed on the front and back surface sides of the workpiece, it is impossible to carry out the above-described alignment by using a normal imaging unit having sensitivity to the visible light ray. In this case, for example, an imaging unit having sensitivity to a near-infrared ray transmitted through the coating layers is used. However, if the pattern for alignment formed in the workpiece does not reflect the near-infrared ray (specifically, for example, if the pattern absorbs the near-infrared ray), it is impossible to properly detect the pattern in the workpiece although the imaging unit having sensitivity to the near-infrared ray is used. For this reason, with the conventional processing method, it is difficult to accurately process such a workpiece.

Thus, an object of the present invention is to provide a processing method suitable for processing of a workpiece having coating layers that allow transmission of a near-infrared ray through the coating layers and reflect electromagnetic waves with the other wavelengths and an alignment mark that absorbs this near-infrared ray.

In accordance with an aspect of the present invention, there is provided a processing method for processing a workpiece having a substrate that allows transmission of a near-infrared ray with wavelengths in a predetermined range through the substrate, an alignment mark that is formed on the front surface side of the substrate and absorbs the near-infrared ray, and coating layers with which the front surface side and a back surface side of the substrate are coated. The coating layers allow transmission of the near-infrared ray through the coating layers and reflect electromagnetic waves with wavelengths other than the wavelengths in the predetermined range. The processing method includes a holding step of holding the front surface side of the workpiece on which the alignment mark is formed by a holding table having a holding surface that reflects the near-infrared ray and exposing the back surface side and an imaging step of emitting the near-infrared ray toward the back surface side of the workpiece held by the holding table and imaging the workpiece by an imaging unit that has sensitivity to the near-infrared ray and faces the back surface side of the workpiece to form a captured image after the holding step is carried out. The processing method also includes an alignment mark detection step of detecting the alignment mark based on the captured image after the imaging step is carried out and a processing step of processing the workpiece held by the holding table by a processing unit based on the detected alignment mark after the alignment mark detection step is carried out.

In the processing method in accordance with the one aspect of the present invention, the near-infrared ray emitted to the workpiece is absorbed by the alignment mark whereas the near-infrared ray is transmitted through the workpiece and reaches the holding table in the other region. The near-infrared ray that has reached the holding table is reflected by the holding surface of this holding table. Thus, by imaging the workpiece by the imaging unit having sensitivity to the near-infrared ray and forming the captured image, the alignment mark can be properly detected based on the captured image. Thus, according to the processing method in accordance with the one aspect of the present invention, it becomes possible to properly process the workpiece having the coating layers that allow transmission of the near-infrared ray through the coating layers and reflect electromagnetic waves with the other wavelengths and the alignment mark that absorbs this near-infrared ray.

The above and other objects, features and advantages of the present invention and the manner of realizing them will become more apparent, and the invention itself will best be understood from a study of the following description and appended claim with reference to the attached drawings showing a preferred embodiment of the invention.

DETAILED DESCRIPTION OF THE PREFERRED EMBODIMENT

An embodiment according to one aspect of the present invention will be described with reference to the accompanying drawings. A processing method according to the present embodiment is a processing method for processing a workpiece having coating layers that allow transmission of a near-infrared ray through the coating layers and reflect electromagnetic waves with the other wavelengths and an alignment mark that absorbs this near-infrared ray. The processing method includes a holding step (see FIG. 1A), an imaging step (see FIG. 1B), an alignment mark detection step (see FIG. 2A), and a cutting step (processing step) (see FIG. 2B). In the holding step, the front surface side of the workpiece on which the alignment mark is formed is held by a chuck table (holding table) having a holding surface that reflects the near-infrared ray and the back surface side is exposed. In the imaging step, the near-infrared ray is emitted toward the back surface side of the workpiece, and the workpiece is imaged by an imaging unit (imaging means) that faces the back surface side of this workpiece and has sensitivity to the near-infrared ray to form an image (captured image). In the alignment mark detection step, the position of the alignment mark is detected based on the image formed in the imaging step. In the cutting step, the workpiece is cut (processed) by a cutting unit (cutting means, processing unit, processing means) based on the position of the alignment mark detected in the alignment mark detection step. The processing method according to the present embodiment will be described in detail below.

Figure 1A:
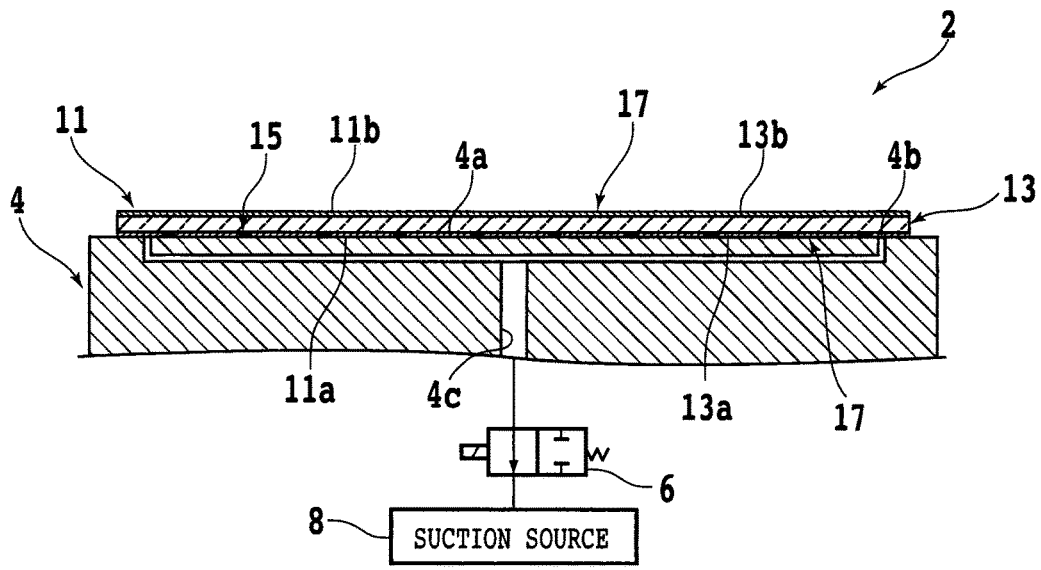
FIG. 1A is a schematic diagram for explaining a holding step.

In the processing method according to the present embodiment, first the holding step of holding the workpiece by the chuck table is carried out. FIG. 1A is a schematic diagram for explaining the holding step. The holding step is carried out by using cutting apparatus (processing apparatus) 2 shown in FIG. 1A, for example. The cutting apparatus 2 includes a chuck table (holding table) 4 for holding a workpiece 11. The chuck table 4 is joined to a rotational drive source (not shown) such as a motor, for example, and rotates around a rotation axis substantially parallel to the vertical direction. Furthermore, a processing-feed mechanism (not shown) is provided below the chuck table 4 and the chuck table 4 moves in a processing-feed direction by this processing-feed mechanism. The upper surface of the chuck table 4 serves as a holding surface 4a for sucking and holding the workpiece 11. The holding surface 4a is formed into a mirror surface shape and reflects at least part (wavelengths in a partial range of 780 to 2500 nm) of a near-infrared ray (electromagnetic waves having wavelengths of 780 to 2500 nm), for example. Moreover, an opening 4b is made at part of the holding surface 4a. This opening 4b is connected to a suction source 8 through a suction path 4c formed inside the chuck table 4, a valve 6, and so forth. By opening the valve 6 and causing a negative pressure of the suction source 8 to act on the opening 4b, the workpiece 11 is sucked and held by the chuck table 4.

The workpiece 11 includes a substrate 13 that allows transmission of the near-infrared ray as the above-described part (partial range) (hereinafter, referred to simply as the near-infrared ray) through the substrate 13. This substrate 13 is formed by using a material such as glass, quartz, or sapphire, for example. However, there is no particular limit to the material, shape, size, and so forth of the substrate 13. For example, it is also possible to use a wafer including a semiconductor material such as silicon as the substrate 13. On the side of a front surface 13a of the substrate 13, alignment marks (patterns) 15 that absorb the near-infrared ray are formed. Furthermore, the side of the front surface 13a and the side of a back surface 13b of the substrate 13 are coated with coating layers 17 that allow transmission of the near-infrared ray through the coating layers 17 and reflect light (electromagnetic waves) with the other wavelengths. For example, the alignment marks 15 are formed of a material that shows absorbability with respect to the near-infrared ray, and the coating layers 17 are formed of a material that shows transmissibility with respect to the near-infrared ray and shows reflectivity with respect to light with the other wavelengths (typically visible light ray).

However, there is no limit to the material, shape, size (thickness), and so forth, of the alignment marks 15 and the coating layers 17. For example, it is also possible to form the alignment marks 15 by a method of altering (modifying) the front surface 13a of the substrate 13 or the like. The workpiece 11 configured in this manner is processed along planned processing lines (streets) 19 (see FIG. 2A) specified based on the alignment marks 15.

In the holding step, the side of a front surface 11a of the workpiece 11 corresponding to the side of the front surface 13a of the substrate 13 is brought into contact with the holding surface 4a of the chuck table 4 and the valve 6 is opened to cause the negative pressure of the suction source 8 to act on the workpiece 11. Thereby, the workpiece 11 is held by the chuck table 4 in the state in which the coating layer 17 on the side of a back surface 11b on the opposite side to the front surface 11a is exposed upward. To the side of the front surface 11a of the workpiece 11, a protective member or the like that allows transmission of the near-infrared ray through the protective member may be stuck in advance.

Figure 1B:
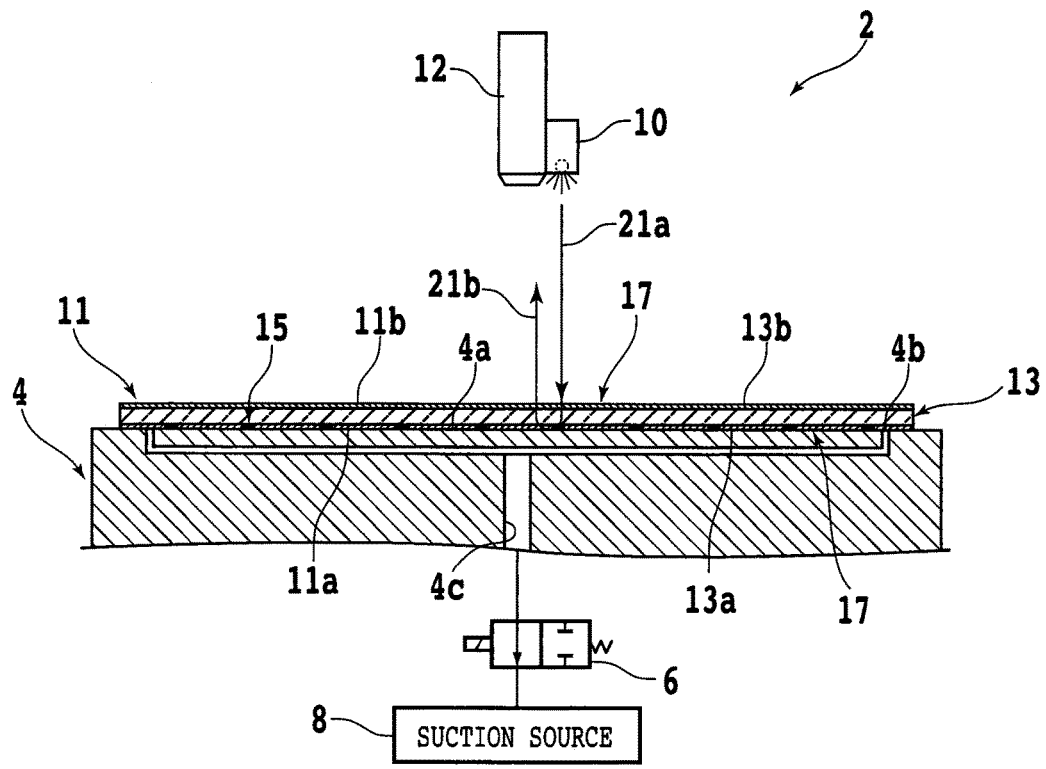
FIG. 1B is a schematic diagram for explaining an imaging step.

After the holding step, the imaging step of imaging the workpiece 11 by the imaging unit (imaging means) having sensitivity to the near-infrared ray and forming an image is carried out. FIG. 1B is a schematic diagram for explaining the imaging step. The imaging step is carried out by using the cutting apparatus 2 continuously. As shown in FIG. 1B, a light source (near-infrared ray radiation means) 10 for radiating the near-infrared ray is disposed above the chuck table 4. Furthermore, an imaging unit (imaging means) 12 for imaging the workpiece 11 is provided at a position adjacent to the light source 10. The light source 10 emits a near-infrared ray 21a with such a wavelength as to be transmitted through the substrate 13 and the coating layers 17 toward the side of the back surface 11b of the workpiece 11. As this light source 10, a lamp in which halogen, rare gas, and so forth are enclosed, an infrared light emitting diode (LED), an infrared laser diode (LD), and so forth can be used, for example. However, there is no particular limit to the kind and so forth of the light source 10. The imaging unit 12 includes an imaging element (light receiving element) having sensitivity to the near-infrared ray 21a and images the workpiece 11 and so forth in the state of being irradiated with the near-infrared ray 21a to form an image (captured image). The light source 10 and the imaging unit 12 are supported by a movement mechanism (not shown) and move in an indexing-feed direction perpendicular to the processing-feed direction and in the vertical direction (direction perpendicular to the processing-feed direction and the indexing-feed direction) by this movement mechanism.

In the imaging step, first the chuck table 4 is moved relative to the light source 10 and the imaging unit 12 and the light source 10 and the imaging unit 12 are positioned above an arbitrary region of the workpiece 11. Thereafter, the near-infrared ray 21a is emitted from the light source 10 toward the side of the back surface 11b of the workpiece 11. In conjunction with this, the workpiece 11 is imaged by the imaging unit 12. As described above, the substrate 13 and the coating layers 17 forming the workpiece 11 allow transmission of the near-infrared ray 21a through the substrate 13 and the coating layers 17 and the alignment marks 15 absorb the near-infrared ray 21a. For this reason, the near-infrared ray 21a emitted to the regions corresponding to the alignment marks 15 is absorbed by the alignment marks 15 and does not reach the chuck table 4. On the other hand, the near-infrared ray 21a emitted to the other region is transmitted through the coating layers 17 and the substrate 13 and reaches the chuck table 4.

The holding surface 4a of the chuck table 4 is configured to be capable of reflecting the near-infrared ray 21a. Thus, the near-infrared ray 21a transmitted through the coating layers 17 and the substrate 13 to reach the chuck table 4 is reflected by the holding surface 4a of the chuck table 4. Part of a near-infrared ray 21b after the reflection is similarly transmitted through the coating layers 17 and the substrate 13 and reaches the imaging unit 12. Based on this near-infrared ray 21b, the imaging unit 12 forms an image (captured image) 23 (see FIG. 2A) suitable for discrimination of the alignment marks 15. The formed image 23 is stored in a storing unit (not shown) of the cutting apparatus 2 together with information relating to the positional relationship between the chuck table 4 and the imaging unit 12, for example.

Figure 2A:
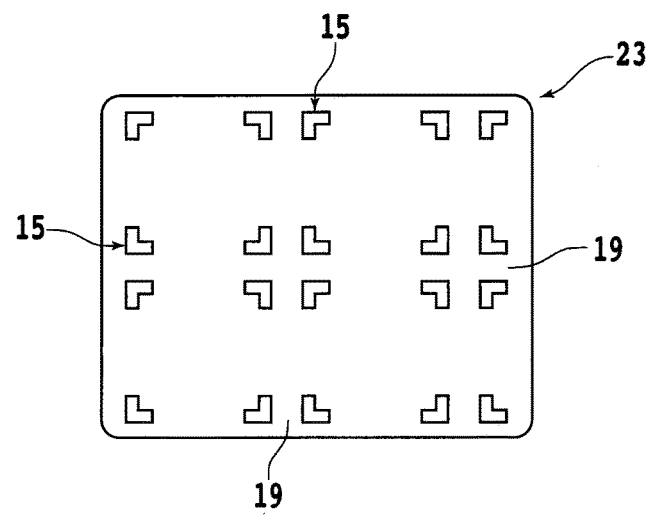
FIG. 2A is a schematic diagram for explaining an alignment mark detection step.

After the imaging step, the alignment mark detection step of detecting the positions of the alignment marks 15 based on the formed image 23 is carried out. This alignment mark detection step is carried out by a control unit (control means) (not shown) of the cutting apparatus 2, for example. FIG. 2A is a schematic diagram for explaining the alignment mark detection step.

As shown in FIG. 2A, in the image 23 formed in the imaging step, the alignment marks 15 are captured in a discriminable form. In the alignment mark detection step, for example by a method of pattern matching or the like to search for a shape having a high correlation with a shape registered in advance, the alignment marks 15 in the image 23 are found out and the positions thereof (coordinates in the image 23) are obtained. As described above, the positional relationship between the chuck table 4 and the imaging unit 12 in acquisition of the image 23 is stored in the storing unit of the cutting apparatus 2. Thus, the control unit can recognize the positions of the alignment marks 15 in the cutting apparatus 2 from this positional relationship and the positions (coordinates) of the alignment marks 15 in the image 23. That is, the control unit can recognize the position of the planned processing line 19 specified by the alignment marks 15.

Figure 2B:
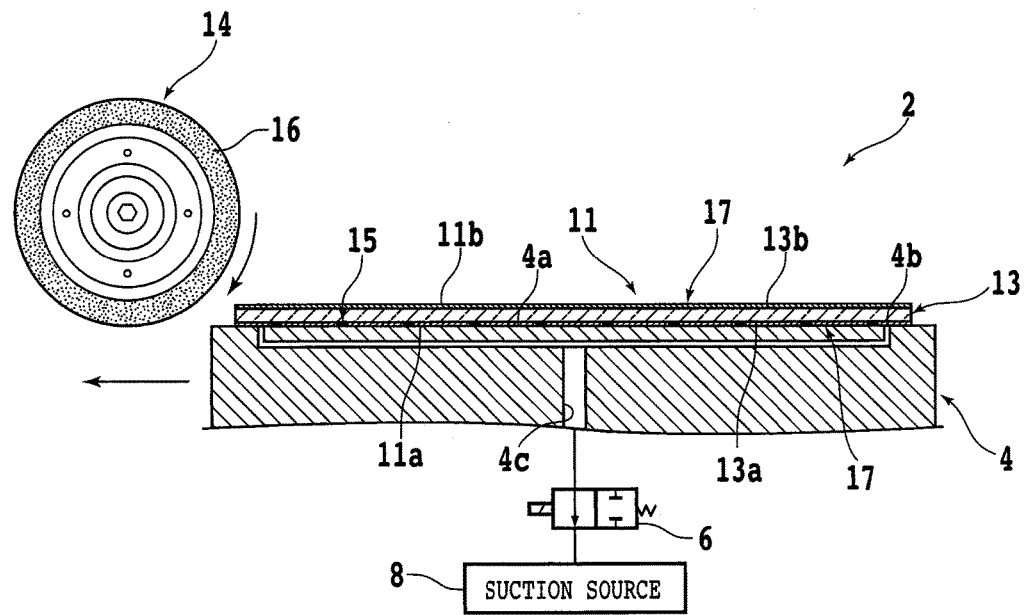
FIG. 2B is a schematic diagram for explaining a cutting step (processing step).

After the alignment mark detection step, the cutting step of cutting the workpiece 11 based on the detected positions of the alignment marks 15 is carried out. FIG. 2B is a schematic diagram for explaining the cutting step. The cutting step is carried out by using the cutting apparatus 2 continuously. As shown in FIG. 2B, the cutting apparatus 2 further includes a cutting unit (cutting means, processing unit, processing means) 14 disposed above the chuck table 4.

The cutting unit 14 includes a spindle (not shown) that serves as a rotation axis substantially perpendicular to the processing-feed direction (substantially parallel to the indexing-feed direction). An annular cutting blade 16 obtained by dispersing abrasive grains in a binding material is mounted to one end side of the spindle. A rotational drive source (not shown) such as a motor is joined to the other end side of the spindle and the cutting blade 16 mounted to the one end side of the spindle rotates by a force transmitted from this rotational drive source. Furthermore, the spindle is supported by the above-described movement mechanism (not shown). The cutting blade 16 moves in the indexing-feed direction and the vertical direction by this movement mechanism. A nozzle (not shown) for supplying a cutting liquid to the cutting blade 16 and the workpiece 11 is disposed near the cutting blade 16.

In the cutting step, first the chuck table 4 is rotated to adjust the direction in which the planned processing line 19 as the target extends to the processing-feed direction of the cutting apparatus 2. Furthermore, the chuck table 4 and the cutting unit 14 are relatively moved to adjust the position of the cutting blade 16 to the upper side of an extended line of the planned processing line 19 as the target. Then, the lower end of the cutting blade 16 is moved to a position that is at least lower than the back surface 11b of the workpiece 11. Thereafter, the chuck table 4 is moved in the processing-feed direction while the cutting blade 16 is rotated. In conjunction with this, the cutting liquid is supplied from the nozzle to the cutting blade 16 and the workpiece 11. Thereby, the cutting blade 16 can be made to cut into the workpiece 11 along the planned processing line 19 of the target and the workpiece 11 can be cut. The above-described rotation of the chuck table 4 and the relative movement of the chuck table 4 and the cutting unit 14 are carried out based on the positions of the alignment marks 15 (planned processing line 19) checked in the alignment mark detection step.

As described above, in the processing method of the present embodiment, the near-infrared ray 21a emitted to the workpiece 11 is absorbed by the alignment marks 15 whereas the near-infrared ray 21a is transmitted through the workpiece 11 and reaches the chuck table (holding table) 4 in the other region. The near-infrared ray 21a that has reached the chuck table 4 is reflected by the holding surface 4a of this chuck table 4. Thus, by imaging the workpiece 11 by the imaging unit (imaging means) 12 having sensitivity to the reflected near-infrared ray 21b and forming the image (captured image) 23, the alignment marks 15 can be properly detected based on this image 23.

The present invention is not limited to the description of the above-described embodiment and can be carried out with various changes. For example, in the above-described embodiment, the example in which the workpiece 11 is cut by using the cutting apparatus 2 including the cutting unit (cutting means) 14 is explained. However, the processing method of the present invention is not limited to this form. For example, it is also possible to use laser processing apparatus (processing apparatus) including a laser processing unit (laser processing means, processing unit, processing means) and process the workpiece 11 by a laser beam.

The present invention is not limited to the details of the above described preferred embodiment. The scope of the invention is defined by the appended claim and all changes and modifications as fall within the equivalence of the scope of the claims are therefore to be embraced by the invention.

What is claimed is:

1. A processing method for processing a workpiece having a substrate that allows transmission of a near-infrared ray with wavelengths in a predetermined range through the substrate, an alignment mark that is formed on a front surface side of the substrate and absorbs the near-infrared ray, and coating layers with which the front surface side and a back surface side of the substrate are coated, the coating layers allowing transmission of the near-infrared ray through the coating layers and reflecting electromagnetic waves with wavelengths other than the wavelengths in the predetermined range, the processing method comprising:
    a holding step of holding the front surface side of the workpiece on which the alignment mark is formed by a holding table having a holding surface that reflects the near-infrared ray and exposing the back surface side;
    an imaging step of emitting the near-infrared ray toward the back surface side of the workpiece held by the holding table and imaging the workpiece by an imaging unit that has sensitivity to the near-infrared ray and faces the back surface side of the workpiece to form a captured image after the holding step is carried out;

an alignment mark detection step of detecting the alignment mark based on the captured image after the imaging step is carried out; and a processing step of processing the workpiece held by the holding table by a processing unit based on the detected alignment mark after the alignment mark detection step is carried out.

\* \* \* \* \*